United States Patent
Goto et al.

(10) Patent No.: US 12,027,451 B2
(45) Date of Patent: Jul. 2, 2024

(54) WIRING SUBSTRATE

(71) Applicant: IBIDEN CO., LTD., Gifu (JP)

(72) Inventors: Shuhei Goto, Ogaki (JP); Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 133 days.

(21) Appl. No.: 17/822,319

(22) Filed: Aug. 25, 2022

(65) Prior Publication Data
US 2023/0070624 A1    Mar. 9, 2023

(30) Foreign Application Priority Data
Sep. 3, 2021   (JP) .................................. 2021-144132

(51) Int. Cl.
*H05K 1/11*      (2006.01)
*H01L 23/498*    (2006.01)

(52) U.S. Cl.
CPC .. *H01L 23/49811* (2013.01); *H01L 23/49822* (2013.01); *H01L 23/49838* (2013.01); *H01L 23/49866* (2013.01)

(58) Field of Classification Search
CPC ......... H05K 1/111; H05K 1/112; H05K 1/113
See application file for complete search history.

(56) References Cited

U.S. PATENT DOCUMENTS

| | | | | |
|---|---|---|---|---|
| 2006/0252249 A1* | 11/2006 | Hsu | ........................ | H01L 24/03 257/E21.508 |
| 2011/0278054 A1* | 11/2011 | Lee | ........................ | H05K 1/111 174/250 |
| 2016/0050752 A1* | 2/2016 | Kang | ..................... | H05K 3/243 174/257 |

FOREIGN PATENT DOCUMENTS

JP        2018-082130 A    5/2018

* cited by examiner

*Primary Examiner* — Sherman Ng
(74) *Attorney, Agent, or Firm* — Oblon, McClelland, Maier & Neustadt, L.L.P.

(57) ABSTRACT

A wiring substrate includes an insulating layer, a conductor layer formed on the insulating layer and including a conductor pad, and a solder resist layer formed on the insulating layer such that the solder resist layer has an opening entirely exposing an upper surface and a side surface of the conductor pad. The conductor layer is formed such that the conductor pad has a pad body extending along a surface of the insulating layer, and a protective layer covering an upper surface and a side surface of the pad body and including material different from material of the pad body, and the pad body of the conductor pad has a notch part formed at a peripheral edge portion of the pad body such that the notch part separates a lower surface of the pad body and the surface of the insulating layer and is filled with the protective layer.

20 Claims, 5 Drawing Sheets

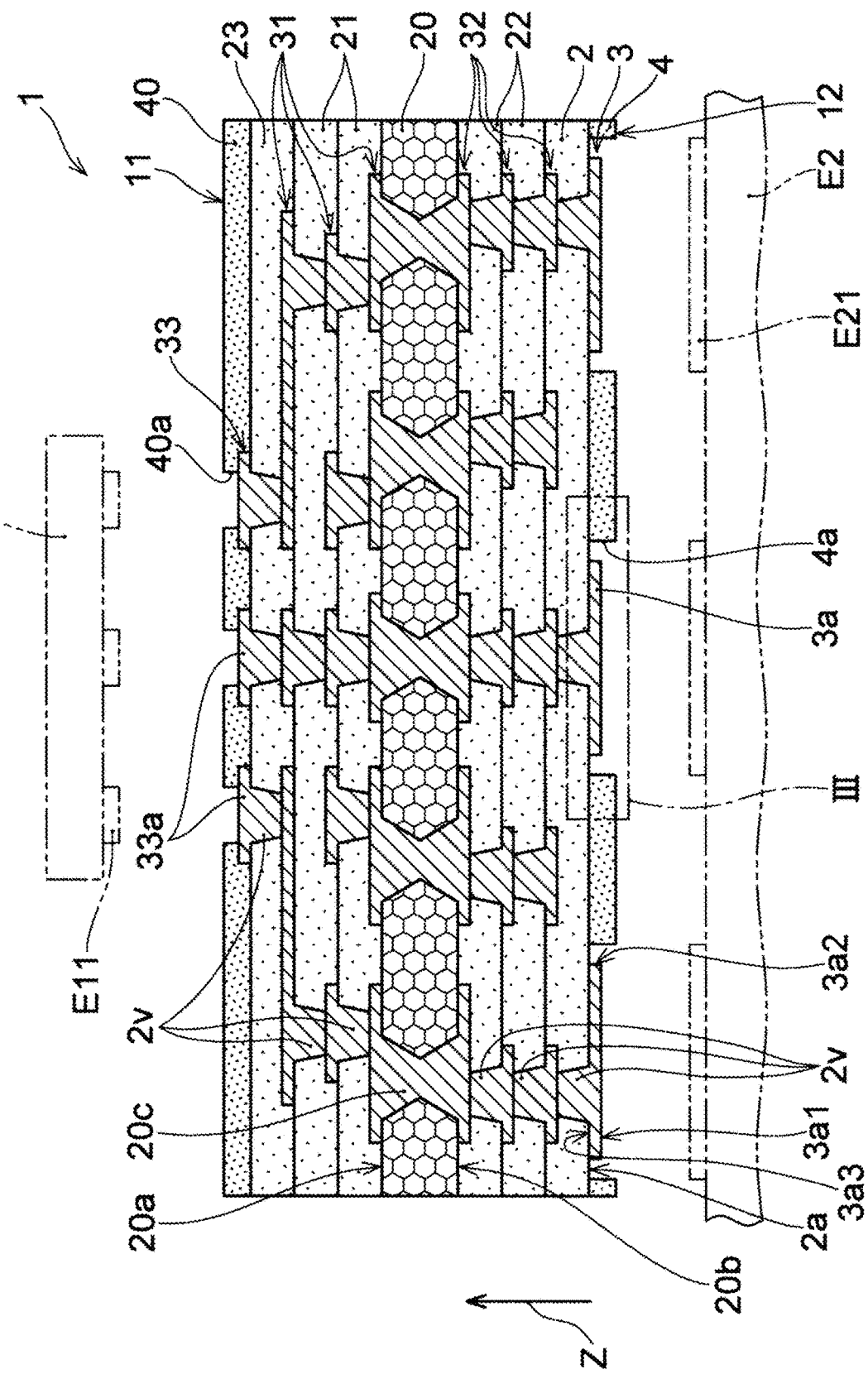

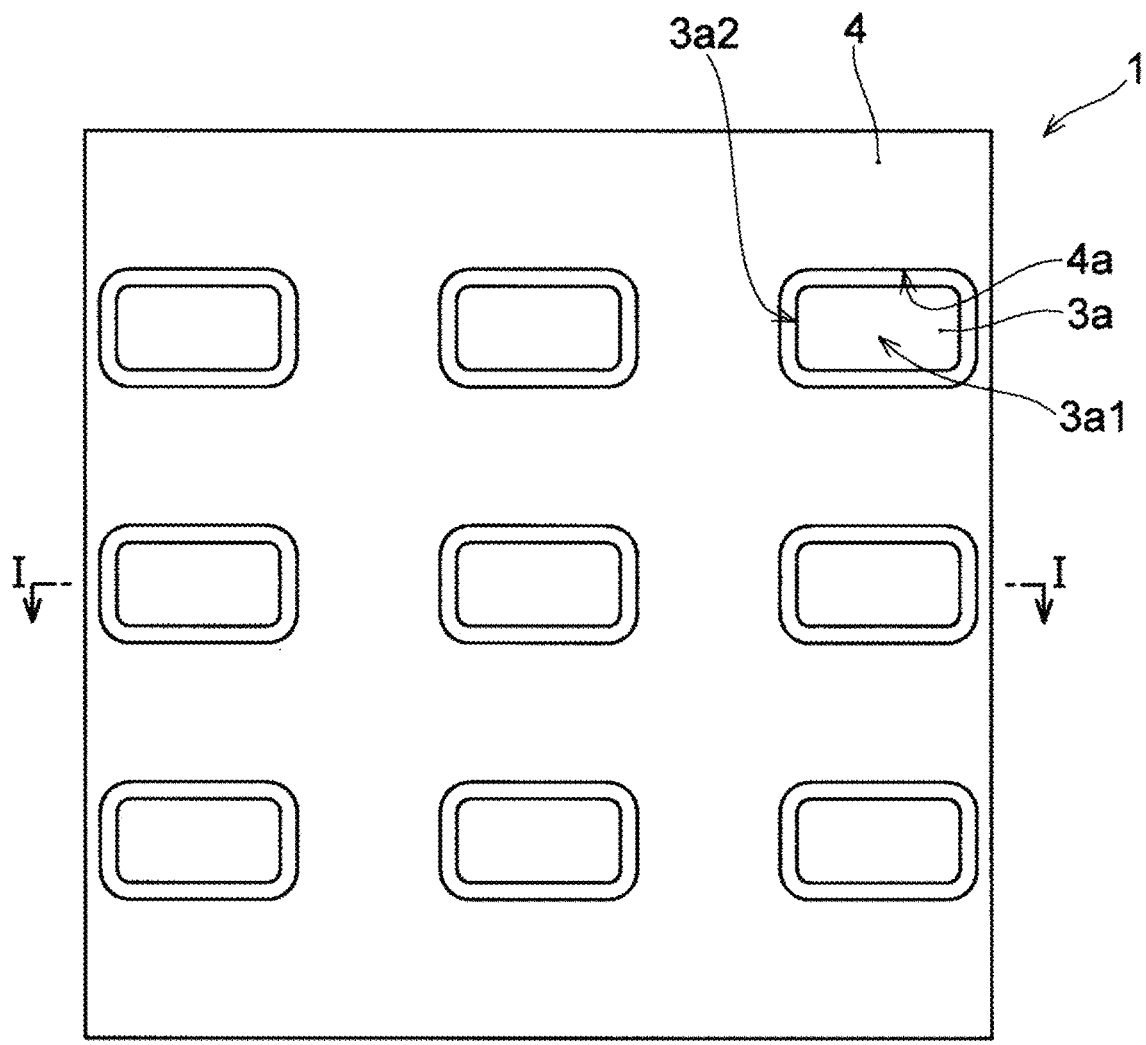
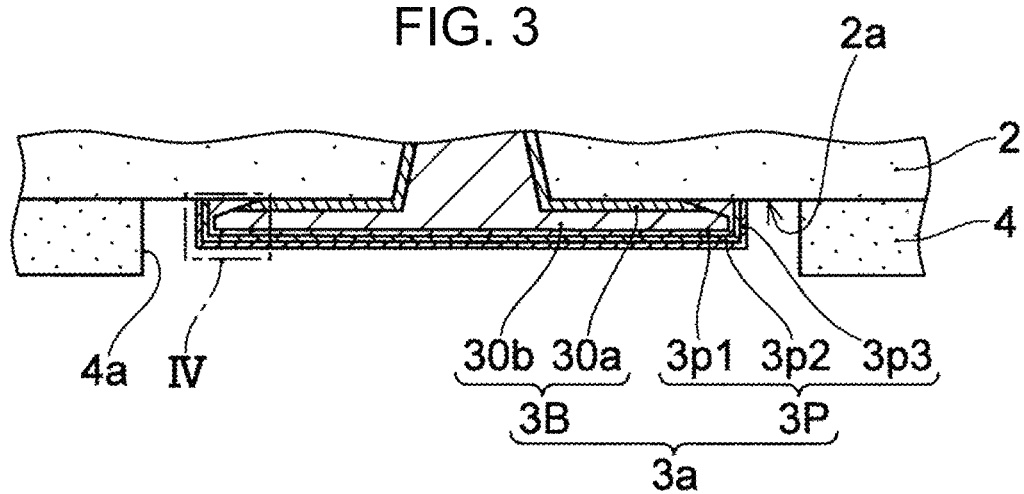

WIRING SUBSTRATE

CROSS-REFERENCE TO RELATED APPLICATIONS

The present application is based upon and claims the benefit of priority to Japanese Patent Application No. 2021-144132, filed Sep. 3, 2021, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2018-82130 describes protruding electrodes (bumps) that protrude from an upper surface of an insulating layer (solder resist layer). The entire contents of this publication are incorporated herein by reference.

SUMMARY OF THE INVENTION

According to one aspect of the present invention, a wiring substrate includes an insulating layer, a conductor layer formed on the insulating layer and including a conductor pad, and a solder resist layer formed on the insulating layer such that the solder resist layer has an opening entirely exposing an upper surface and a side surface of the conductor pad of the conductor layer. The conductor layer is formed such that the conductor pad has a pad body extending along a surface of the insulating layer, and a protective layer covering an upper surface and a side surface of the pad body and including a material different from a material of the pad body, and the pad body of the conductor pad has a notch part formed at a peripheral edge portion of the pad body such that the notch part separates a lower surface of the pad body and the surface of the insulating layer and is filled with the protective layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view illustrating an example of a wiring substrate according to an embodiment of the present invention;

FIG. 2 is a plan view illustrating an example of a wiring substrate according to an embodiment of the present invention;

FIG. 3 is an enlarged view of a portion (III) of FIG. 1;

DETAILED DESCRIPTION OF THE EMBODIMENTS

Figure 4:
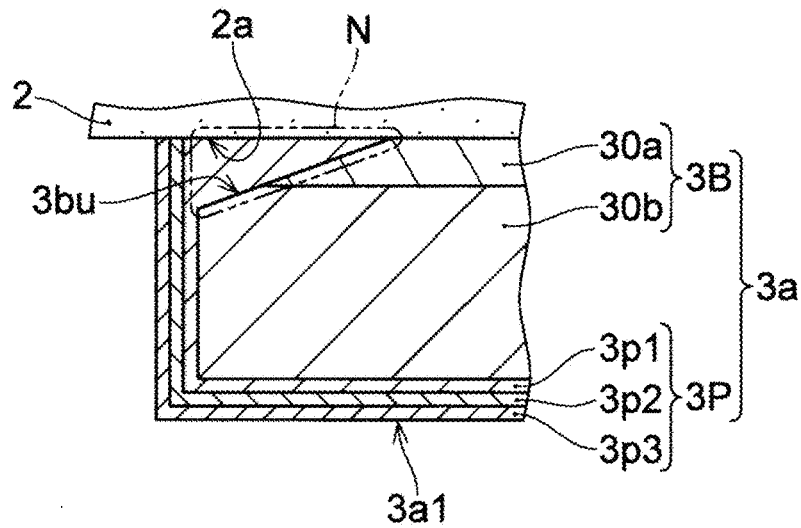
FIG. 4 is an enlarged view of a portion (IV) of FIG. 3.

Embodiments will now be described with reference to the accompanying drawings, wherein like reference numerals designate corresponding or identical elements throughout the various drawings.

A wiring substrate according to an embodiment of the present invention is described with reference to the drawings. The drawings to be referenced below are drawn such that features according to embodiments of the present invention are easily understood, without intending to show exact proportions of structural elements. FIG. 1 illustrates a cross-sectional view of a wiring substrate 1, which is an example of the wiring substrate of the embodiment. Further, FIG. 2 illustrates a plan view of the wiring substrate 1 as seen from a lower side of the sheet of paper of FIG. 1. A cross-sectional view along a line (I-I) of FIG. 2 is FIG. 1. Further, FIG. 3 illustrates an enlarged view of a portion (III) of FIG. 1.

As illustrated in FIG. 1, the wiring substrate 1 includes an insulating layer 20, and conductor layers and insulating layers that are alternately laminated on both sides of the insulating layer 20. On one side (20a) of the insulating layer 20, three conductor layers 31 and two insulating layers 21 are alternately laminated and an insulating layer 23 (second insulating layer) is further laminated thereon. Then, a conductor layer (second conductor layer) 33 is formed on the insulating layer 23.

On the other side (20b), which is the opposite side with respect to the one side (20a), of the insulating layer 20, three conductor layers 32 and two insulating layers 22 are alternately laminated and an insulating layer (first insulating layer) 2 is further laminated thereon. Then, a conductor layer (first conductor layer) 3 is formed on a surface (upper surface) (2a) of the insulating layer 2. That is, a back surface (lower surface) (3a3) of the conductor layer 3 is in contact with the insulating layer 2.

A solder resist layer 40 is formed on the insulating layer 23 and the conductor layer 33. A solder resist layer 4 is formed on the insulating layer 2. The wiring substrate 1 of the embodiment includes at least the insulating layer 2, the conductor layer 3 formed on the surface (2a) of the insulating layer 2, and the solder resist layer 4 formed on the surface (2a) of the insulating layer 2.

The wiring substrate 1 has a first surface 11 and a second surface 12 on the opposite side with respect to the first surface 11, as two surfaces extending in a direction orthogonal to a thickness direction of the wiring substrate 1. In the wiring substrate 1, the insulating layer 23, the conductor layer 33, and the solder resist layer 40 are formed on the first surface 11 side of the wiring substrate 1, and form a surface layer part on the first surface 11 side of the wiring substrate 1. The first surface 11 is formed of exposed surfaces of the conductor layer 33 and the solder resist layer 40. Further, the insulating layer 2, the conductor layer 3, and the solder resist layer 4 are formed on the second surface 12 side of the wiring substrate 1, and form a surface layer part on the second surface 12 side of the wiring substrate 1. The second surface 12 is formed of exposed surfaces of the insulating layer 2, the conductor layer 3, and the solder resist layer 4. As will be described in detail later, the first surface 11 forms a component mounting surface on which an external component (E1) is mounted, and the second surface 12 forms a connecting surface to be connected to an external element (E2).

In the description of the wiring substrate 1, of each element of the wiring substrate 1, a side farther from the insulating layer 20 is referred to as "upper," "upper side," "outer side," or "outer," and a side closer to the insulating layer 20 is referred to as "lower," "lower side," "inner side," or "inner." In the description of each of the insulating layers (2, 21, 22, 23) and the conductor layers (3, 31, 32, 33), a surface facing the insulating layer 20 is also referred to as a "lower surface" and a surface facing the opposite side with respect to the insulating layer 20 is also referred to as an "upper surface." Therefore, in the wiring substrate of the embodiment, the surface (2a) of the first insulating layer 2 facing the first conductor layer 3 is also referred to as the upper surface (2a) of the first insulating layer 2. The surface (back surface) (3a3) of the first conductor layer 3 facing the first insulating layer 2 is also referred to as the lower side (3a3) of the first conductor layer 3. A surface (3a1) of the first conductor layer 3 on the opposite side with respect to the lower surface (3a3) is also referred to as an upper surface (3a1) of the first conductor layer 3.

Through-hole conductors (20c) connecting the conductor layer 31 and the conductor layer 32 are formed in the insulating layer 20. The insulating layer 20, the conductor layer 31 on the one side (20a), and the conductor layer 32 on the other side (20b) form a core substrate of the wiring substrate 1. In each of the insulating layers (2, 21, 22, 23), via conductors (2v) that connect the conductor layers sandwiching the each of the insulating layers (2, 21, 22, 23) are formed.

Each of the insulating layers (2, 20, 21, 22, 23) is formed, for example, using an insulating resin such as an epoxy resin, a bismaleimide triazine resin (BT resin) or a phenol resin. Each of the insulating layers may contain a reinforcing material (core material) such as a glass fiber and/or inorganic filler such as silica.

Each of the solder resist layers (4, 40) is formed, for example, using any insulating resin such as an epoxy resin or a polyimide resin. The solder resist layer 40 has openings (40a) that partially or entirely expose the conductor layer 33. In the example of FIG. 1, the openings (40a) partially expose the conductor layer 33. The solder resist layer 4 has openings (4a) that expose the conductor layer 3.

The conductor layers (3, 31, 32, 33), the via conductors (2v), and the through-hole conductors (20c) are formed using any metal such as copper or nickel, and are each formed of, for example, a metal foil such as a copper foil and/or a metal film formed by plating or sputtering or the like. The conductor layers (3, 31, 32, 33), the via conductors (2v), and the through-hole conductors (20c) are simplified and illustrated in FIG. 1 as each having a single-layer structure for clarity but each may have a multilayer structure that includes two or more metal layers. However, it is also possible that the conductor layer 3 and the conductor layers (31, 32, 33), the via conductors (2v), and the through-hole conductors (20c) each have a single-layer structure including only one metal layer.

The conductor layers are patterned to have predetermined conductor pads and/or wiring patterns. In the wiring substrate 1 of the example of FIG. 1, the conductor layer 33 is patterned to have multiple conductor pads (component mounting pads) (33a). That is, the wiring substrate 1 includes the multiple component mounting pads (33a) formed on the first surface 11. In the example of FIG. 1, each of the component mounting pads (33a) is a so-called SMD (Solder Mask Defined) type conductor pad. That is, peripheral edge portions of the component mounting pads (33a) are covered by the solder resist layer 40, and portions other than the peripheral edge portions of the component mounting pad (33a) are exposed in the openings (40a) of the solder resist layer 40.

The component mounting pads (33a) are conductor pads (second conductor pads) on surfaces of which a component (E1) mounted on the wiring substrate 1 is placed when the wiring substrate 1 is used. That is, the first surface 11 is a component mounting surface of the wiring substrate 1. For example, electrodes (E11) of the component (E1) are electrically and mechanically connected to the component mounting pads (33a) via a bonding material (not illustrated in the drawings) such as solder. Examples of the component (E1) include electronic components such as an active component such as a semiconductor integrated circuit device or a transistor, and a passive component such as an electrical resistor. It is also possible that the component (E1) is a wiring material that includes fine wirings formed on a semiconductor substrate. However, the component (E1) is not limited to these.

In the present embodiment, the conductor layer 3 includes conductor pads (first conductor pads) (3a). The conductor pads (3a) are exposed by the openings (4a) of the solder resist layer 4. Specifically, an upper surface (3a1) (facing the opposite side with respect to the insulating layer 2) and a side surface (3a2) of each of the conductor pads (3a) are entirely exposed without being covered by the solder resist layer 4. That is, each of the conductor pads (3a) is a so-called NSMD (Non-Solder Mask Defined) type conductor pad of which an outer peripheral edge in a plan view is not defined by an opening of a solder resist layer. The side surface (3a2) of each of the conductor pads (3a) is a surface between the lower surface (3a3) (facing the insulating layer 2) and the upper surface (3a1) of the each of the conductor pads (3a), and, as illustrated in FIG. 2, is a surface that forms an outer peripheral edge of the each of the conductor pads (3a) in a plan view. The term "plan view" means viewing an object such as a conductor pad (3a) along the thickness direction of the wiring substrate 1, and FIG. 2 illustrates a plan view from the second surface 12 side of the wiring substrate 1 on which the conductor pads (3a) are formed.

When the wiring substrate 1 itself is mounted on an external wiring substrate, for example, an external element (E2) such as a motherboard of any electrical device, the second surface 12 on which the contact pads (3a) are exposed is a connecting surface to be connected to the external element (E2). Further, in the wiring substrate 1 of the example of FIG. 1, similarly to the first surface 11, the second surface 12 may be a component mounting surface on which an electronic component such as a semiconductor integrated circuit device is mounted.

When the second surface 12 is a connecting surface to the external element (E2), the second surface 12 has connecting parts to the external element (E2). The wiring substrate 1 of the example of FIG. 1 is connected to the external element (E2) at the conductor pads (3a). Therefore, the conductor pads (3a) in the example of FIG. 1 are connection pads to be connected to the external element (E2) in the wiring substrate 1, and the connection pads to the external element (E2) in the wiring substrate 1 of FIG. 1 are formed of the conductor pads (3a). As described above, the entire upper surfaces (3a1) and the entire side surfaces (3a2) of the conductor pads (3a) are exposed in the openings (4a) of the solder resist layer 4 without being covered by the solder resist layer 4. Therefore, the wiring substrate 1 and the external element (E2) are firmly connected to each other with a large area.

As illustrated in FIG. 2, each of the conductor pads (3a) may have a rectangular planar shape. A "planar shape" is a shape of an object such as a conductor pad (3a) in a plane view. Here, "a rectangular shape" means a shape surrounded by two sides (line segments) that are substantially parallel to each other and two sides (line segments) that are substantially parallel to each other and orthogonal to the other two sides. In this "rectangular shape," two sides that are adjacent and orthogonal to each other do not have to connect to each other so as to form a right-angled intersection at the point of intersection, but may be joined via a curve. The conductor pads (3a) are electrically and mechanically connected to electrodes (E21) of the external element (E2) by a bonding material such as solder. As described above, the external element (E2) may be a motherboard of any electrical device, or may be any electronic component having a package size larger than that of the wiring substrate 1. Without being limited to these, the conductor pads (3a) are connected to any substrate, electrical component, mechanical component, or the like.

Next, with reference to FIG. 3, which is an enlarged view of a portion (III) including a conductor pad (3a) in FIG. 1, the conductor pad (3a) is described in detail. In FIG. 1, each conductor pad (3a) in the wiring substrate 1 is simplified and illustrated as having a single-layer structure for clarity. However, as illustrated in FIG. 3, each conductor pad (3a) included in the conductor layer 3 has a pad body (3B) including a metal film (30a) and a plating film (30b), and a protective layer (3P) covering an upper surface and a side surface of the pad body (3B). The metal film (30a) is formed on the upper surface (2a) of the insulating layer 2, and the plated film (30b) is formed on a surface of the metal film (30a) on the opposite side with respect to the insulating layer 2. The metal film (30a) is formed, for example, by electroless plating or sputtering or the like. The plated film (30b) is formed, for example, by electrolytic plating using the metal film (30a) as a power feeding layer. Although not illustrated in FIG. 3, of the wiring substrate 1 illustrated in FIG. 1, the conductor layer 33, the conductor layers 31 and the conductor layers 32 formed on the insulating layers 21 or the insulating layers 22, the via conductors (2v), and each of the through-hole conductors (20c) also may have a structure that includes a metal film and a plating film similar to the pad body (3B) illustrated in FIG. 3.

The protective layer (3P) is, for example, a coating film formed for corrosion prevention and/or rust prevention of exposed portions such as the upper surface and the side surface of the pad body (3B). The protective layer (3P) is a coating film containing a material different from that of the pad body (3B). When the pad body (3B) is formed of copper, the protective layer (3P) may be formed of nickel, palladium, silver, gold, or an alloy thereof. In the illustrated example, the protective layer (3P) has a three-layer structure including a lower layer (3p1) formed on the pad body (3B) side, a middle layer (3p2) covering the lower layer (3p1), and an upper layer (3p3) formed on the middle layer (3p2).

For example, the lower layer (3p1) contains nickel, the middle layer (3p2) contains palladium, and the upper layer (3p3) contains gold.

Next, with reference to FIG. 4, which is an enlarged view of a portion (IV) near a peripheral edge of the pad body (3B) surrounded by a one-dot chain line in FIG. 3, the conductor pad (3a) is further described in detail. A lower surface (3bu) of the pad body (3B) of the conductor pad (3a) separates from the upper surface (2a) of the insulating layer 2 at a peripheral edge portion of the pad body (3B) in a planar direction (extension direction of the upper surface (2a) of the insulating layer 2). By the separation of the lower surface (3bu) of the pad body (3B) from the upper surface (2a) of the insulating layer 2, a notch part (N) is formed which is a region between the lower surface (3bu) of the pad body (3B) and the upper surface (2a) of the insulating layer 2 and is surrounded by a two-dot chain line in FIG. 4. As will be described later, the notch part (N) may be formed in a process in which the metal film (30a) is partially removed from the upper surface (2a) of the insulating layer 2 during pattern formation of the conductor layer 3 (that is, when the pad body (3B) is formed).

The entire surface of the pad body (3B) other than a portion in contact with the insulating layer 2 is covered by the protective layer (3P). In particular, the lower surface (3bu) of the pad body (3B), which forms the notch part (N) and separates from the insulating layer 2, is also covered by the protective layer (3P). Therefore, a relatively large bonding area between the protective layer (3P) and the pad body (3B) is ensured as compared to a case where only the side surface and the upper surface of the pad body are covered by the protective layer. It is thought that it may be possible to suppress occurrence of a defect such as peeling at an interface between the pad body (3B) and the protective layer (3P).

Further, the protective layer (3P) also covers the upper surface (2a) of the insulating layer 2 forming the notch part (N) and completely fills the notch part (N). By having such a structure, it may be possible that a stress that is applied to the interface between the pad body (3B) and the protective layer (3P) is effectively dispersed to the insulating layer 2. Specifically, when the wiring substrate 1 is connected to an external element, a stress that is applied to the interface between the pad body (3B) and the protective layer (3P) due to an external force on the upper surface (3a1) of the conductor pad (3a) is effectively dispersed to the insulating layer 2 via a contact part of the protective layer (3P) with the insulating layer 2. It is thought that it is possible to more effectively suppress occurrence of a defect such as peeling at the interface between the pad body (3B) and the protective layer (3P). An outermost side of a portion of the protective layer (3P) in contact with the upper surface (2a) of the insulating layer 2 forms an outer peripheral edge of the conductor pad (3a) in a plan view.

In particular, in each conductor pad (3a) in the present embodiment, the interface between the pad body (3B) and the protective layer (3P) is continuous with an interface between the protective layer (3P) and the insulating layer 2. Therefore, it is thought that, at the interface between the pad body (3B) and the protective layer (3P), especially at an end part thereof, a portion where a stress concentrates is unlikely to form and interfacial peeling is effectively suppressed.

In the illustrated example, a distance between the lower surface (3bu) of the pad body (3B) and the surface (2a) of the insulating layer 2, which are separated from each other, increases toward the peripheral edge of the pad body (3B). In other words, a width of the notch part (N) separating the peripheral edge portion of the pad body (3B) from the surface (2a) (separation distance between the surface (2a) and the pad body (3B)) increases toward an outer periphery of the conductor pad (3a). That is, the width of the notch part (N) is maximized at the peripheral edge of the pad body (3B). With the notch part (N) having such a shape, for example, in forming the protective layer (3P) in the notch part (N) using a plating solution, occurrence of a defect such as a void is suppressed, and the protective layer (3P) is relatively satisfactorily formed.

The width of the notch part (N) is preferably ⅓ or less of a thickness of the pad body (3B). That is, the notch part (N) may be formed in a region within ⅓ of the thickness of the pad body (3B) from the upper surface (2a) of the insulating layer 2. In this way, the notch part (N) has a relatively sharp shape toward a center portion of the pad body (3B). Therefore, the protective layer (3P) is relatively firmly bonded to the pad body (3B) and the insulating layer 2 due to an anchor effect. It may be possible to further reduce a risk that peeling at the interface between the protective layer (3P) and the pad body (3B) may occur due to an external force applied to the conductor pad (3a).

Figure 5:
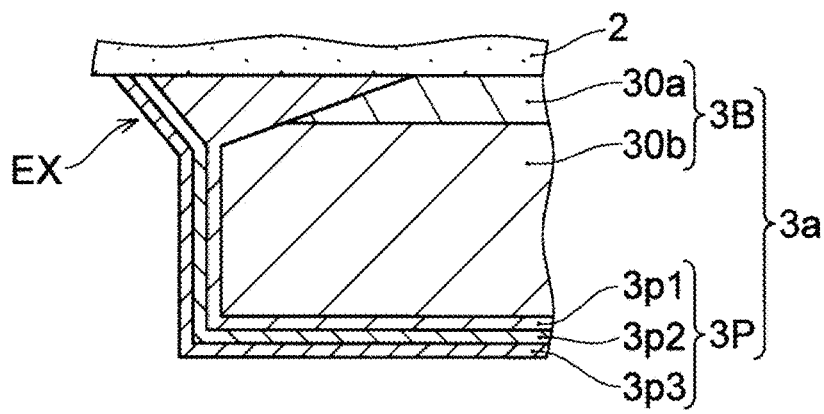
FIG. 5 is an enlarged view, which corresponds to FIG. 4, of another example of a wiring substrate according to an embodiment of the present invention.

From a point of view of more effectively dispersing a stress that is applied to the interface between the protective layer (3P) and the pad body (3B) to the insulating layer 2, a contact area between the protective layer (3P) and the insulating layer 2 is enlarged. FIG. 5 illustrates an example in which, near the notch part (N) of the pad body (3B), an expansion part (EX) is formed in which the contact part of the protective layer (3P) with the insulating layer 2 expands toward an outer side of the conductor pad (3a) in a plan view.

The expansion part (EX) may be formed by adjusting an application state of a catalyst for plating deposition near the notch part of the pad body (3B) during the formation of the protective layer (3P). By forming the expansion part (EX), the contact area between the conductor pad (3a) and the insulating layer 2 is increased. In particular, the area of the interface between the protective layer (3P) and the insulating layer 2 that is continuous with the interface between the pad body (3B) and the protective layer (3P) is expanded. Therefore, it is thought that the above-described stress that is applied to the interface between the pad body (3B) and the protective layer (3P) is more effectively dispersed to the insulating layer 2. It is thought that peeling at the interface between the pad body (3B) and the protective layer (3P) is more effectively suppressed.

A wiring substrate according to an embodiment of the present invention may be manufactured using any common method for manufacturing a wiring substrate. With reference to FIGS. 6A-6F, an example of a manufacturing method is outlined using a case where the wiring substrate 1 illustrated in FIG. 1 is manufactured as an example.

Figure 6A:
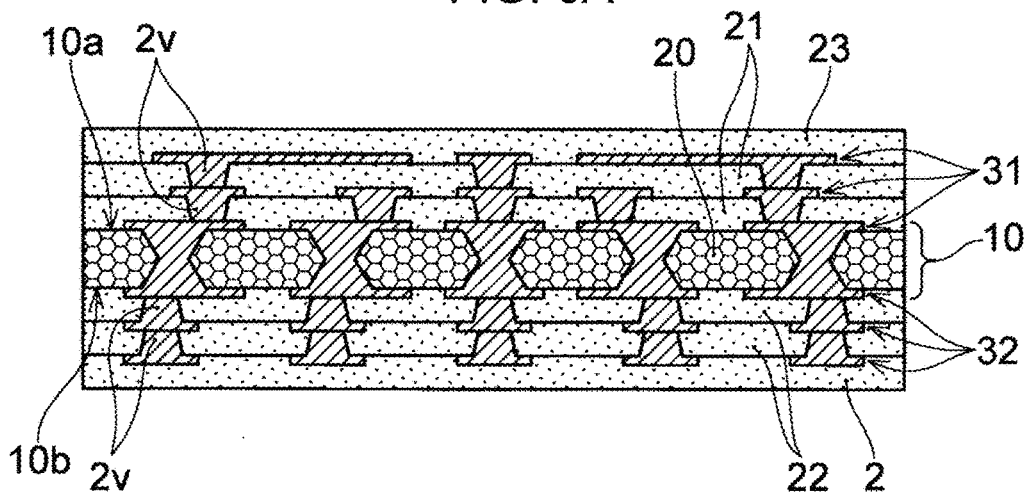
FIG. 6A is a cross-sectional view illustrating an example of a state of a wiring substrate according to an embodiment of the present invention during a manufacturing process.

As illustrated in FIG. 6A, a core substrate 10 is prepared, an insulating layer 21 is laminated on a one-surface (10a) side of the core substrate 10, and a conductor layer 31 is formed on the insulating layer 21. Similarly, an insulating layer 22 is laminated on an other-surface (10b) side of the core substrate 10, and a conductor layer 32 is formed on the insulating layer 22. Then, on the both sides of the core substrate 10, lamination of an insulating layer and formation of a conductor layer are repeated, and the outermost insulating layer 23 and the outermost insulating layer 2 are respectively formed on the one-surface (10a) side and the other-surface (10b) side of the core substrate 10.

In the preparation of the core substrate 10, for example, a double-sided copper-clad laminate containing the insulating layer 20 is prepared. Then, the core substrate 10 is prepared using a subtractive method or the like to form the conductor layers (31, 32) including predetermined conductor patterns on the both sides of the insulating layer 20 and form the through-hole conductors (20c) in the insulating layer 20. Each of the insulating layers (21, 22), and the conductor layers (31, 32) on the insulating layer 21 or the insulating layer 22 may be formed, for example, using a common method for manufacturing a build-up substrate. For example, each of the insulating layers is formed by thermo-compression bonding an epoxy resin on a film onto the core substrate 10 or onto an insulating layer and a conductor layer formed earlier. Further, each of the conductor layers may be formed using any method for forming a conductor pattern such as a semi-additive method or a full additive method, including plating resist formation and pattern plating, and the like. In the formation of the conductor layers using a method for forming a conductor pattern, such as a semi-additive method, the via conductors (2v) may be formed in the insulating layers.

Figure 6B:
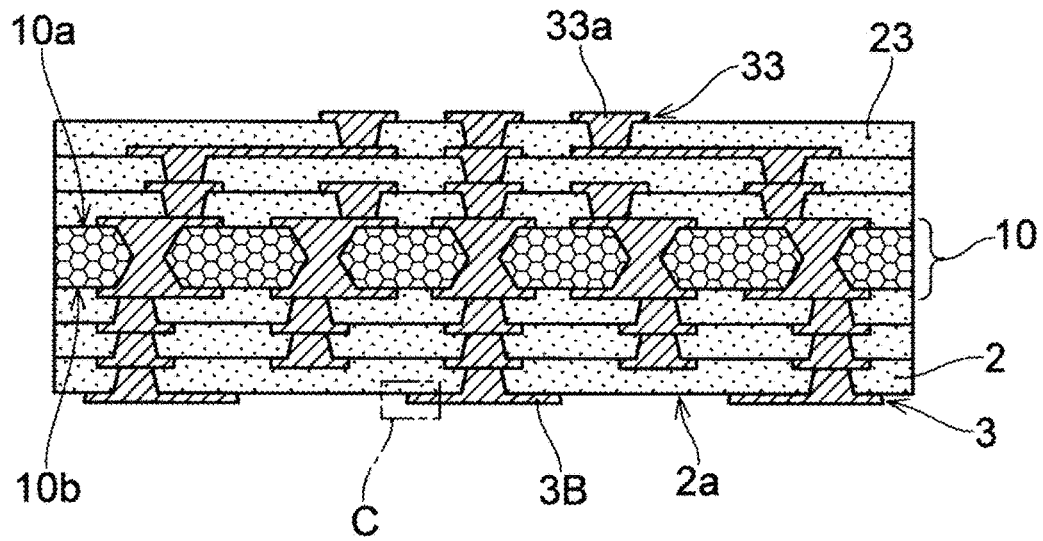
FIG. 6B is a cross-sectional view illustrating an example of a state of a wiring substrate according to an embodiment of the present invention during a manufacturing process.

Next, as illustrated in FIG. 6B, the conductor layers (3, 33) are formed on the insulating layers. Similar to the conductor layers (31, 32), the conductor layers (3, 33) are formed, for example, using a semi-additive method. A metal film is formed by electroless plating or sputtering or the like on the surface (2a) of the insulating layer 2 and in through holes of the insulating layer 2 formed by laser irradiation or the like. Similarly, a metal film is also formed on the insulating layer 23 on the one-surface (10a) side of the core substrate 10. Pad bodies (3B) are formed by forming a plating resist, in which opening patterns are formed corresponding to positions at which the pad bodies (3B) are to be formed, on the metal film formed on the insulating layer 2 and forming a plating film in the openings, and removing the metal film after the plating resist is peeled off. Also on the insulating layer 23, conductor pads (33a) are formed in a similar process.

Figure 6C:
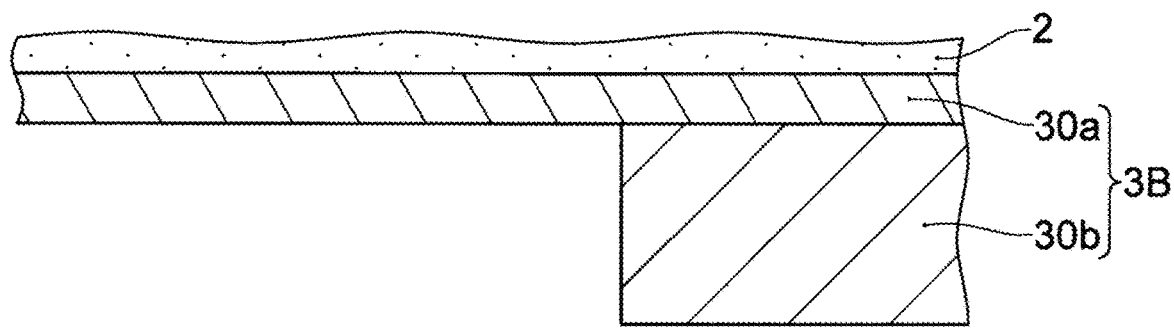
FIG. 6C is a cross-sectional view illustrating an example of a state of a wiring substrate according to an embodiment of the present invention during a manufacturing process.
Figure 6D:
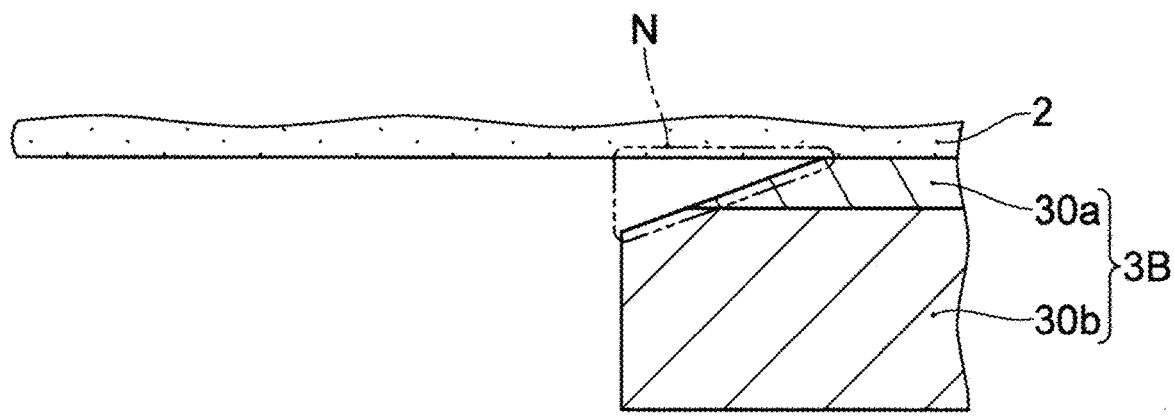
FIG. 6D is a cross-sectional view illustrating an example of a state of a wiring substrate according to an embodiment of the present invention during a manufacturing process.

FIG. 6C illustrates an enlarged view of a state of a portion (C), which is a peripheral edge portion of a pad body (3B) in FIG. 6B, after the plating resist is peeled off and before the metal film (30a) is removed by etching in the formation of the pad body (3B). The metal film (30a) exposed after the plating resist is peeled off as described above may be removed by quick etching using a strong base solution. In this etching, due to a difference in wraparound of the etching solution, locally fast etching is realized at a corner where the side surface of the plating film (30b) and the upper surface of the metal film (30a) of the pad body (3B) are in contact with each other. As a result, as illustrated in FIG. 6D, the metal film (30a) positioned directly under the plating film (30b) is etched in a wedge shape. Further, as illustrated in the drawing, it may be possible that a portion of the plating film (30b) near the contact part with the metal film (30a) is also partially etched. The pad body (3B) having the notch part (N) in the peripheral edge portion thereof is formed.

Figure 6E:
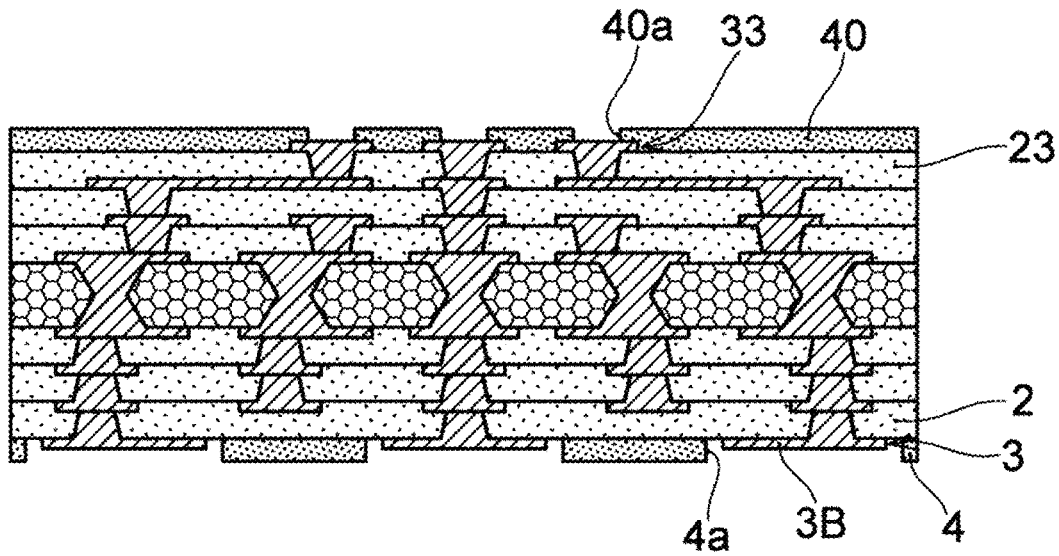
FIG. 6E is a cross-sectional view illustrating an example of a state of a wiring substrate according to an embodiment of the present invention during a manufacturing process.

Next, as illustrated in FIG. 6E, a solder resist layer 40 is formed on the insulating layer 23 and the conductor layer 33, and a solder resist layer 4 is formed on the insulating layer 2 and the conductor layer 3. Each of the solder resist layers (4, 40) is provided with openings (4a) or openings (40a). Each of the solder resist layers (4, 40) may be formed, for example, by applying, spraying, or laminating in a form of a film, a photosensitive epoxy resin or a polyimide resin or the like. Then, the openings (4a, 40a) are formed, for example, by exposure and development, or laser processing, or the like. The pad bodies (3B) are completely exposed through the openings (4a). The conductor layer 33 is partially exposed from the openings (40a).

Figure 6F:
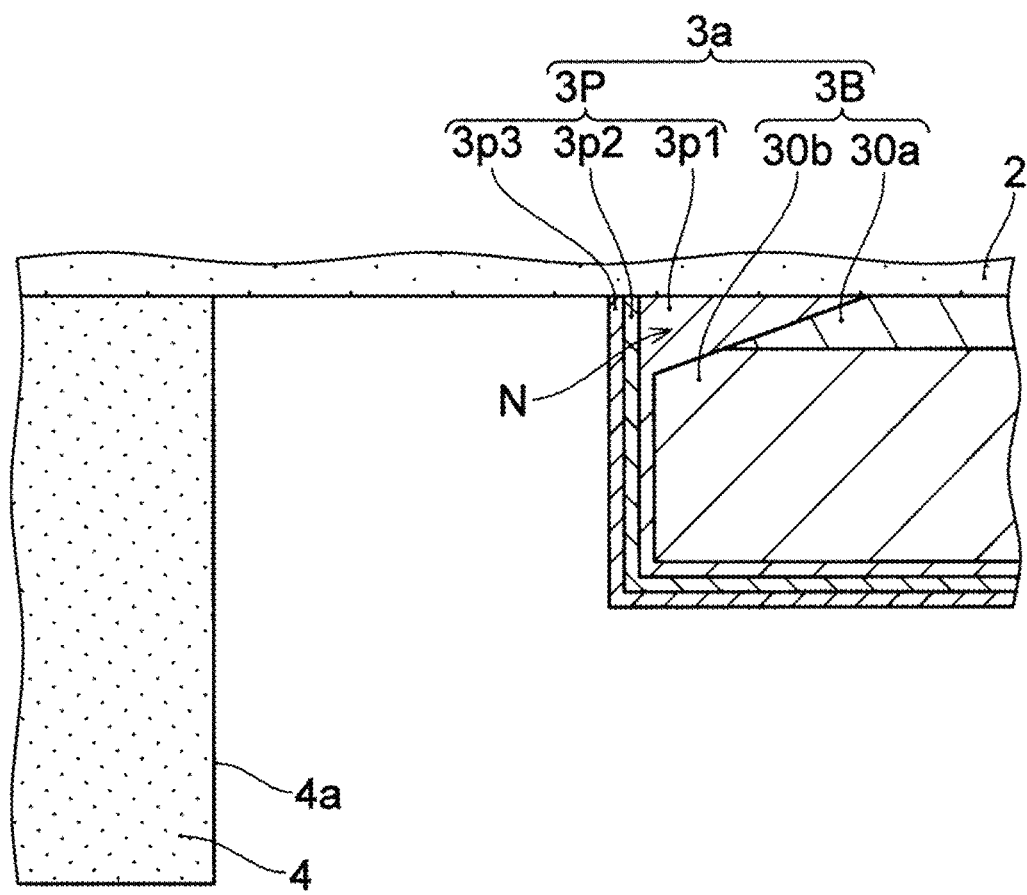
FIG. 6F is a cross-sectional view illustrating an example of a state of a wiring substrate according to an embodiment of the present invention during a manufacturing process.

Next, a protective layer (3P) is formed on a surface of each pad body (3B) exposed on the surface of the wiring substrate 1. As illustrated in FIG. 6F, which is an enlarged view of a peripheral edge portion of a pad body (3B), the protective layer (3P) is formed on the surface of the pad body (3B) exposed in the opening (4a). First, for example, an electroless nickel plating solution containing a nickel compound, hydrazine, and the like is used, and an electroless nickel plating layer is formed as a lower layer (3p1) so as to cover the entire exposed surface of the pad body (3B). The lower layer (3p1) of the protective layer (3P) is formed so as to completely fill the notch part (N) of the pad body (3B). Prior to deposition of the lower layer (3p1), a catalyst for plating deposition such as palladium may be applied to the upper surface of the insulating layer 2 near the notch part (N).

Subsequently, an electroless palladium plating layer is formed as a middle layer (3p2) on a surface of the lower layer (3p1). For example, a reduced electroless palladium plating solution containing a palladium compound and a hypophosphorous acid compound or the like is used, and an electroless palladium plating layer is formed. Subsequently, for example, an electroless gold plating layer is formed as an upper layer (3p3) on the middle layer (3p2). For example, the electroless gold plating layer is formed using a reduced electroless gold plating solution containing a gold compound and hexamethylenetetramine or the like. Formation of the conductor pad (3a) formed of the pad body (3B) and the protective layer (3P) is completed. Layer thicknesses of the lower layer (3p1), the middle layer (3p2), and the upper layer (3p3) may be adjusted by adjusting concentrations, temperatures, immersion times, and the like of the plating solutions. At the same time as the protective layer (3P) is formed on the surface of the pad body (3B), a protective film may also be formed on a surface of each of the conductor pads (33a) exposed on the opposite side with respect to the conductor pads (3a) in the wiring substrate 1. Through the above processes, the wiring substrate 1 in the example of FIG. 1 is completed.

When the protective layer (3P) having the expansion part (EX) of the form illustrated in FIG. 5 is formed, a lower layer (3p1) that expands in a planar direction may be formed by adjusting an application state of the catalyst for plating deposition on the upper surface of the insulating layer 2 near the notch part (N) when the lower layer (3p1) is formed, and adjusting a concentration, a temperature, an immersion time, and the like of the plating solution in the electroless plating that deposits the lower layer (3p1).

The wiring substrate of the embodiment is not limited to those having the structures illustrated in the drawings and those having the structures, shapes, and materials exemplified in the present specification. A wiring substrate according to an embodiment of the present invention may have any laminated structure. For example, the wiring substrate of the embodiment may be a coreless substrate that does not include a core substrate. A wiring substrate according to an embodiment of the present invention may include any number of conductor layers and any number of insulating layers. The wiring substrate of the embodiment may be a so-called double-sided substrate or single-sided substrate. A pad body of a conductor pad that separates at an edge part thereof from a surface of a lower-layer insulating layer may be provided on a surface on each of both sides of a wiring substrate or may be provided on a surface on only one side of a wiring substrate. The solder resist layer 4 may cover portions of the conductor layer 3 other than the conductor pads (3a) while entirely exposing the conductor pads (3a) in the openings (4a).

Japanese Patent Application Laid-Open Publication No. 2018-82130 describes protruding electrodes (bumps) that protrude from an upper surface of an insulating layer (solder resist layer). Each of the protruding electrodes has a protruding metal layer extending on the upper surface of the insulating layer and a surface metal layer partially covering the protruding metal layer. A notch that forms a space between a lower surface of the protruding metal layer and the insulating layer is provided at an outer periphery of the protruding metal layer.

The surface metal layer described in Japanese Patent Application Laid-Open Publication No. 2018-82130 is formed so as to cover only a side surface and an upper surface of the protruding metal layer and is not in contact with the upper surface of the insulating layer. It is thought that a bonding strength between the surface metal layer and the protrusion metal layer is relatively low. It is thought that peeling between the surface metal layer and the protruding metal layer may occur and electrical characteristics of the protruding electrodes may deteriorate.

A wiring substrate according to an embodiment of the present invention has a first surface and a second surface on the opposite side with respect to the first surface, and includes: a first insulating layer; a first conductor layer that is formed on the first insulating layer and includes a first conductor pad; and a solder resist layer that is formed on the first insulating layer and has an opening entirely exposing an upper surface and a side surface of the first conductor pad. The first conductor pad has a pad body that extends along a surface of the first insulating layer, and a protective layer that covers an upper surface and a side surface of the pad body and is formed of a material different from the pad body. A notch part is formed at a peripheral edge portion of the pad body such that a lower surface of the pad body separates from an upper surface of the first insulating layer. The notch part is filled with the protective layer.

According to an embodiment of the present invention, it is possible to provide conductor pads in a wiring substrate such that, in a conductor pad with a side surface and an upper surface exposed, strong bonding between a protective layer and a pad body is realized, occurrence of a defect such as peeling between the protective layer and the pad body is suppressed, and electrical characteristics are improved.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
an insulating layer;
a conductor layer formed on the insulating layer and including a conductor pad; and
a solder resist layer formed on the insulating layer such that the solder resist layer has an opening entirely exposing an upper surface and a side surface of the conductor pad of the conductor layer,
wherein the conductor layer is formed such that the conductor pad has a pad body extending along a surface of the insulating layer, and a protective layer covering an upper surface and a side surface of the pad body and comprising a material different from a material of the pad body, and the pad body of the conductor pad has a notch part formed at a peripheral edge portion of the pad body such that the notch part separates a lower surface of the pad body and the surface of the insulating layer and is filled with the protective layer.

2. The wiring substrate according to claim 1, wherein the protective layer has a portion in contact with the surface of the insulating layer and forming an outer peripheral edge of the conductor pad.

3. The wiring substrate according to claim 2, wherein the protective layer has an expansion part at the notch part of the pad body such that the expansion part is expanding toward an outer side of the conductor pad.

4. The wiring substrate according to claim 1, wherein the notch part of the pad body is formed such that a distance between the lower surface of the pad body and the surface of the insulating layer increases toward an outer periphery of the conductor pad.

5. The wiring substrate according to claim 1, wherein the conductor pad of the conductor layer is formed such that the notch part of the pad body is formed within a region of ⅓ or less of a thickness of the pad body from the surface of the insulating layer.

6. The wiring substrate according to claim 1, wherein the wiring substrate has a component mounting surface configured to mount a component, and the conductor layer is formed on an opposite side with respect to the component mounting surface.

7. The wiring substrate according to claim 1, wherein the conductor layer is formed such that the conductor pad has a rectangular planar shape.

8. The wiring substrate according to claim 1, wherein the conductor pad of the conductor layer is formed such that the pad body includes copper and that the protective layer includes nickel.

9. The wiring substrate according to claim 8, wherein the protective layer includes a nickel layer, a palladium layer, and a gold layer.

10. The wiring substrate according to claim 2, wherein the notch part of the pad body is formed such that a distance between the lower surface of the pad body and the surface of the insulating layer increases toward an outer periphery of the conductor pad.

11. The wiring substrate according to claim 2, wherein the conductor pad of the conductor layer is formed such that the notch part of the pad body is formed within a region of ⅓ or less of a thickness of the pad body from the surface of the insulating layer.

12. The wiring substrate according to claim 2, wherein the wiring substrate has a component mounting surface configured to mount a component, and the conductor layer is formed on an opposite side with respect to the component mounting surface.

13. The wiring substrate according to claim 2, wherein the conductor pad of the conductor layer is formed such that the pad body includes copper and that the protective layer includes nickel.

14. The wiring substrate according to claim 13, wherein the protective layer includes a nickel layer, a palladium layer, and a gold layer.

15. The wiring substrate according to claim 3, wherein the notch part of the pad body is formed such that a distance between the lower surface of the pad body and the surface of the insulating layer increases toward an outer periphery of the conductor pad.

16. The wiring substrate according to claim 3, wherein the conductor pad of the conductor layer is formed such that the notch part of the pad body is formed within a region of ⅓ or less of a thickness of the pad body from the surface of the insulating layer.

17. The wiring substrate according to claim 3, wherein the wiring substrate has a component mounting surface configured to mount a component, and the conductor layer is formed on an opposite side with respect to the component mounting surface.

18. The wiring substrate according to claim 3, wherein the conductor pad of the conductor layer is formed such that the pad body includes copper and that the protective layer includes nickel.

19. The wiring substrate according to claim 18, wherein the protective layer includes a nickel layer, a palladium layer, and a gold layer.

20. The wiring substrate according to claim 4, wherein the conductor pad of the conductor layer is formed such that the notch part of the pad body is formed within a region of ⅓ or less of a thickness of the pad body from the surface of the insulating layer.

* * * * *